United States Patent [19]

Brotherton

[11] Patent Number: 5,144,392
[45] Date of Patent: Sep. 1, 1992

[54] THIN-FILM TRANSISTOR CIRCUIT

[75] Inventor: Stanley D. Brotherton, Sussex, England

[73] Assignee: U.S. Philips Corporation, New York, N.Y.

[21] Appl. No.: 727,291

[22] Filed: Jul. 9, 1991

Related U.S. Application Data

[63] Continuation of Ser. No. 606,019, Oct. 30, 1990, abandoned.

[30] Foreign Application Priority Data

Nov. 29, 1989 [GB] United Kingdom ............... 8926956

[51] Int. Cl.$^5$ ............. H01L 29/78; H03K 3/26; G02F 1/13; H02H 3/00
[52] U.S. Cl. ............... 357/23.7; 357/23.14; 357/4; 357/41; 307/318; 307/639; 361/56; 361/91
[58] Field of Search ............ 357/23, 13, 4, 23.7, 357/41; 307/318, 639; 361/56, 91; 350/333

[56] References Cited

U.S. PATENT DOCUMENTS 4,727,213 7/1985 Ariizumi .................. 357/23.13

FOREIGN PATENT DOCUMENTS 59-126663 11/1984 Japan.
59-143368 12/1984 Japan.

OTHER PUBLICATIONS

Fujishin et al–IEEE Journal of Solid–State Circuits vol. SC-20, No. 2, Apr. 1985, pp. 594–596.
Ueda et al–Japanese Journal of Applied Physics, Supplements, Aug. 1986, pp. 81–84.

*Primary Examiner*—Edward J. Wojciechowicz
*Attorney, Agent, or Firm*—Michael E. Marion

[57] ABSTRACT

A thin-film transistor circuit (10) has a main thin-film transistor (Tr1) and an input gate protection device (11) formed by first and second subsidiary thin-film transistors (Tr2) and (Tr3) connected in series and to the gate electrode (1) of the main thin-film transistor (Tr1). The gates (4 and 7) and one of the main electrodes (5 and 9) of each of the first and second subsidiary thin-film transistors (Tr2 and Tr3) are connected. The other main electrodes (6 and 8) of the first and second subsidiary thin-film transistors (Tr2 and Tr3) are connected together so that only one of the first and second subsidiary thin-film transistors (Tr3 and Tr3) conducts when a voltage above a threshold voltage is applied to the gate electrode (1) of the main thin-film transistor (Tr1). The first and second subsidiary thin-film transistors (Tr2 and Tr3) have channel regions (20) of a length (L) selected for causing breakdown of the other one of the first and second subsidiary thin-film transistors (Tr2 and Tr3) when a given voltage greater than the threshold voltage is applied to the gate electrode (1) of the main thin-film transistor (Tr1), thereby rendering both the first and second subsidiary thin-film transistors (Tr2 and Tr3) conducting.

22 Claims, 2 Drawing Sheets

THIN-FILM TRANSISTOR CIRCUIT

This is a continuation of application Ser. No. 07/606,019 filed Oct. 30, 1990, now abandoned.

BACKGROUND OF THE INVENTION

This invention relates to a thin-film transistor circuit comprising a main thin-film transistor and an input gate protection device comprising first and second subsidiary thin-film transistors connected in series to the gate electrode of the main thin-film transistor for protecting the gate of the main thin-film transistor against the effect of excessively high voltages which may arise as a result of, for example, static charge.

Japanese patent application publication No. JP-A-59-16378 describes such a circuit. In the arrangements described in this Japanese application one or more subsidiary thin-film transistors are connected in series between the gate electrode of the main thin-film transistor and earth (ground).

In the example shown in FIG. 3 of JP-A-59-16378 the input gate protection device is formed by two subsidiary thin-film transistors with the first subsidiary thin-film transistor having its gate electrode connected to its drain electrode and to the gate electrode of the main thin-film transistor and the second thin-film transistor similarly having its gate electrode connected to its drain electrode which is also connected to the source electrode of the first subsidiary thin-film transistor.

In operation of this device when a positive gate voltage greater than the threshold voltage of the first subsidiary thin-film transistor is applied to the gate electrode of the main thin-film transistor the first subsidiary thin-film transistor will be rendered conducting and once the voltage at the gate electrode of the second subsidiary thin-film transistor reaches the threshold voltage of the second subsidiary thin-film transistor then this too will conduct, so connecting the gate electrode of the main thin-film transistor to earth (ground) and avoiding breakdown of the gate dielectric.

The voltage at which the input gate protection device will conduct to connect the gate electrode of the main thin-film transistor to earth (ground) is thus determined by the threshold voltages of the subsidiary thin-film transistors and also the number of series-connected subsidiary thin-film transistors used to form the input gate protection device.

FIG. 5 of JP-A-59-16378 illustrates an X-Y matrix drive liquid crystal display device in which a number of main thin-film transistors are provided to form the switching elements of the device. In this example an input gate protection device is provided for each switching element and is in the form of a single subsidiary thin-film transistor. In this case the input gate protection device is designed to protect the associated switching element against excessively high negative voltages on the bus line to which the gate electrode of the main thin-film transistor is connected and so the single subsidiary thin-film transistor has its gate and drain connected together to earth. Again the voltage at which the input gate protection device conducts to connect the gate electrode of the main thin-film transistor or switching element to earth is determined by the threshold voltage of the subsidiary thin-film transistor.

JP-A-59-16378 thus describes two different circuits one designed to protect against positive over-voltages and the other designed to protect against negative over-voltages. It is, however, stated in the description that in each case the opposite polarity of over-voltage can be protected against by p-channel rather than normal n-channel operation of the subsidiary thin-film transistors forming the input gate protection device. Again, however, the over-voltage at which the input gate protection device conducts is determined by the threshold voltage and number of series-connected subsidiary thin-film transistors.

SUMMARY OF THE INVENTION

It is an aim of the present invention to provide a thin-film transistor circuit having an input gate protection device for which the voltage at which conduction occurs is not solely dependent on the threshold voltage of the subsidiary thin-film transistors forming the input gate protection device.

According to the present invention, there is provided a thin-film transistor circuit comprising a main thin-film transistor and an input gate protection device comprising first and second subsidiary thin-film transistors connected in series and to the gate electrode of the main thin-film transistor with the gate and one of the main electrodes of each of the first and second subsidiary thin-film transistors being connected, characterised in that the other main electrodes of the first and second subsidiary thin-film transistors are connected together so that only one of the first and second subsidiary thin-film transistors conducts when a voltage above a threshold voltage is applied to the gate electrode of the main thin-film transistor and in that the first and second subsidiary thin-film transistors have channel regions of a length selected for causing breakdown of the other one of the first and second subsidiary thin-film transistors when a given voltage greater than the threshold voltage is applied to the gate electrode of the main thin-film transistor, thereby rendering both the first and second subsidiary thin-film transistors conducting.

It should, of course, be understood that, as used herein and as is conventional in the art, the term threshold voltage means the voltage applied to the gate electrode at which, with appropriate voltages applied to the main electrodes, current will just begin to flow in the channel region so that above the threshold voltage a conduction channel is established in the channel region.

Using a circuit in accordance with the present invention the voltage at which the input gate protection device conducts to remove an excessively high (negative or positive) voltage from the gate electrode of the main thin-film transistor is determined partly by the threshold voltage of one of the first and second subsidiary thin-film transistors and partly by the voltage at which the other of the first and second subsidiary thin-film transistors breaks down.

Thus when a positive voltage is applied to the gate electrode of the main thin-film transistor the input gate protection device will connect the gate electrode of the main thin-film transistor to earth (ground) when one of the first and second thin-film transistors conducts when its threshold voltage is reached and the other subsidiary thin-film transistor breaks down while when a negative voltage is applied to the gate electrode of the main thin-film transistor, the gate electrode of the main thin-film transistor will be connected to earth (ground) when the other of the subsidiary thin-film transistors conducts when its threshold voltage is reached and the one of the subsidiary thin-film transistors breaks down. It is therefore not necessary to design specific circuits to protect against negative or positive voltages nor is it necessary to rely on p-channel operation of normally n-channel thin-film transistors to protect against over-voltages of a polarity opposite to that for which the circuit was designed.

The inventor has determined that the breakdown mechanism involved is similar to the punch-through breakdown mechanism which occurs in MOSFETs and that the breakdown voltage can be adjusted by altering the length of the channel region of the subsidiary thin-film transistor. Thus, the voltage at which the input gate protection device conducts can be tailored or adjusted simply by controlling the length of the channel region of the subsidiary thin-film transistor. It is therefore not necessary to adjust the threshold voltage by, for example, altering the doping of the channel region or the thickness of the gate dielectric layer. Rather, the voltage at which the input gate protection device conducts can be controlled simply by adjusting the channel length which can be accomplished in a relatively simple manner by altering the mask dimensions. This would enable, if desired, input gate protection devices which conduct at different voltages to be provided within the same integrated circuit in a very simple manner.

Generally, the gate and drain electrodes of the first subsidiary thin-film transistor are connected together and to the gate electrode of the main thin-film transistor and the source and gate electrodes of the second subsidiary thin-film transistor are connected together and to earth (ground) so that when a positive voltage is applied to the gate electrode of the main thin-film transistor the first subsidiary thin-film transistor conducts when its threshold voltage is exceeded while when a negative voltage is applied to the gate electrode of the main thin-film transistor, the second subsidiary thin-film transistor conducts when its threshold voltage is exceeded.

The first and second subsidiary thin-film transistors may have a channel region length selected such that breakdown occurs at a voltage in the range of from about 20 to about 30 volts. The channel regions may be formed of polycrystalline silicon bounded by highly doped n conductivity type contact regions contacting the main electrodes of the transistor. The channel regions may be passivated by plasma hydrogenation.

A plurality of main thin-film transistors may be provided and may be associated with at least one input gate protection device as described above. The main thin-film transistors may be arranged in a matrix of rows and columns of main thin-film transistors with each row of main thin-film transistors having an input gate protection device. In this case, the matrix of main thin-film transistors may form switching elements of a display device driver, for example a liquid crystal display device.

BRIEF DESCRIPTION OF THE DRAWINGS

Embodiments of the invention will now be described, by way of example, with reference to the accompanying drawings, in which.

DETAILED DESCRIPTION OF PREFERRED EMBODIMENTS OF THE INVENTION

Figure 2:
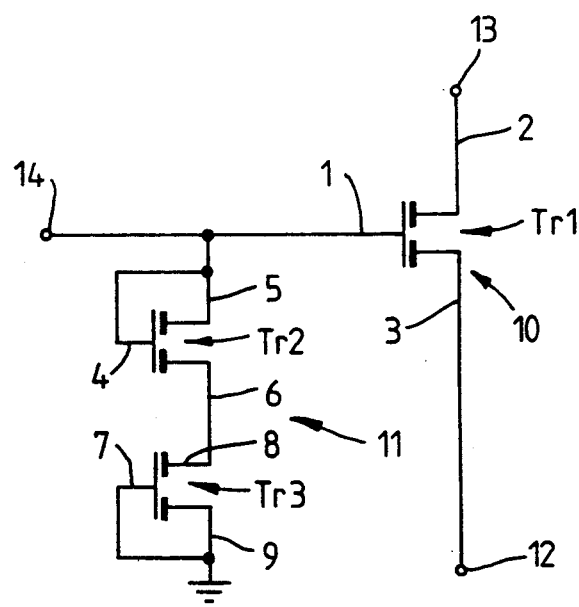
FIG. 2 is a diagram of a thin-film transistor circuit in accordance with the invention.

Referring now to the drawings, especially FIG. 2, there is illustrated a thin-film transistor circuit 10 comprising a main thin-film transistor Tr1 and an input gate protection device 11 comprising first and second subsidiary thin-film transistors Tr2 and Tr3 connected in series and to the gate electrode 1 of the main thin-film transistor Tr1. Gates 4 and 7 are connected respectively to the main electrodes 5 and 9 of each of the first and second subsidiary thin-film transistors Tr2 and Tr3.

In accordance with the invention, the other main electrodes 6 and 8 of the first and second subsidiary thin-film transistors Tr2 and Tr3 are connected together so that only one of the first and second subsidiary thin-film transistors conducts when a voltage above a threshold voltage is applied to the gate electrode 1 of the main thin-film transistor Tr1. The first and second subsidiary thin-film transistors Tr2 and Tr3 have channel regions 20 (FIG. 1) of a length L selected for causing breakdown of the other one of the first and second subsidiary thin-film transistors when a given voltage greater than the threshold voltage is applied to the gate electrode of the main thin-film transistor Tr1, thereby rendering both the first and second subsidiary thin-film transistors Tr2 and Tr3 conducting.

In the example shown in FIG. 2, the drain electrode 5 and gate electrode 4 of the first subsidiary thin-film transistor Tr2 are connected together and to the gate electrode 1 of the main thin-film transistor Tr1 while the gate electrode 7 and source electrode 9 of the second subsidiary thin-film transistor Tr3 are connected together and to earth (ground). The other main electrodes 6 and 8 (that is in this example the source electrode 6 of the first subsidiary thin-film transistor Tr2 and the drain electrode 8 of the second subsidiary thin-film transistor Tr3) of the subsidiary thin-film transistors Tr2 and Tr3 are connected together. The terminal 12 connected to the source electrode 3 of the main thin-film transistor Tr1 may also be connected to earth (ground) or to another part of the circuit (not shown in FIG. 2). An input voltage is applied to the drain electrode 2 of the main thin-film transistor Tr1 via terminal 13 and a gate voltage via terminal 14.

When a positive voltage applied to the gate electrode 1 of the main thin-film transistor exceeds the threshold voltage of the first subsidiary thin-film transistor Tr2, the first subsidiary thin-film transistor Tr2 will be rendered conducting. Once the voltage applied to the gate electrode 1 becomes sufficiently high to cause the second subsidiary thin-film transistor Tr3 to breakdown, the input gate protection device 11 will connect the gate electrode 1 to earth (ground) thus avoiding damage to the main thin-film transistor Tr1, for example avoiding breakdown of the gate dielectric. Alternatively if a negative voltage is applied to the gate electrode 1, when this negative voltage comes sufficiently high the first subsidiary thin film transistor Tr2 will breakdown and the second subsidiary thin-film transistor Tr3 will conduct once its threshold voltage is exceeded so causing conduction of the input gate protection device 11. The same circuit can thus be used to protect against positive or negative over-voltages, for example to protect against static, without having to rely on p-channel operation of normally n-channel thin-film transistors.

The inventor has determined that breakdown of a thin-film transistor occurs in a manner similar to the phenomenon of punch-through in MOSFETs and that the voltage at which breakdown occurs is, as will be explained in more detail below, related to the length L of the channel region 20 of the thin-film transistor. Accordingly the voltage at which the input gate protection device 11 conducts can be controlled or tailored by controlling the length of the channel regions 20 of the subsidiary thin-film transistors Tr2 and Tr3. It is therefore not necessary to adjust the threshold voltage of the subsidiary thin-film transistors Tr2 and Tr3 but simply to adjust the length L of the channel regions 20. This length L can be adjusted in a simple manner by altering mask dimensions and so alterations in process steps, for example adjustment of the doping of the channel region 20 and/or of the thickness of the gate dielectric, which would be necessary to adjust the threshold voltage are not required.

The effect of the length L of the channel region 20 of the subsidiary thin-film transistors Tr2 and Tr3 on their breakdown voltage $V_{BV}$ will now be discussed in greater detail with reference to FIG. 1 which illustrates a typical structure for the thin-film transistors Tr1, Tr2 and Tr3 and FIG. 3 which illustrates graphically the relationship between the length L of the channel region 20 and the breakdown voltage $V_{BV}$ for different types of materials forming the channel region 20.

Figure 1:
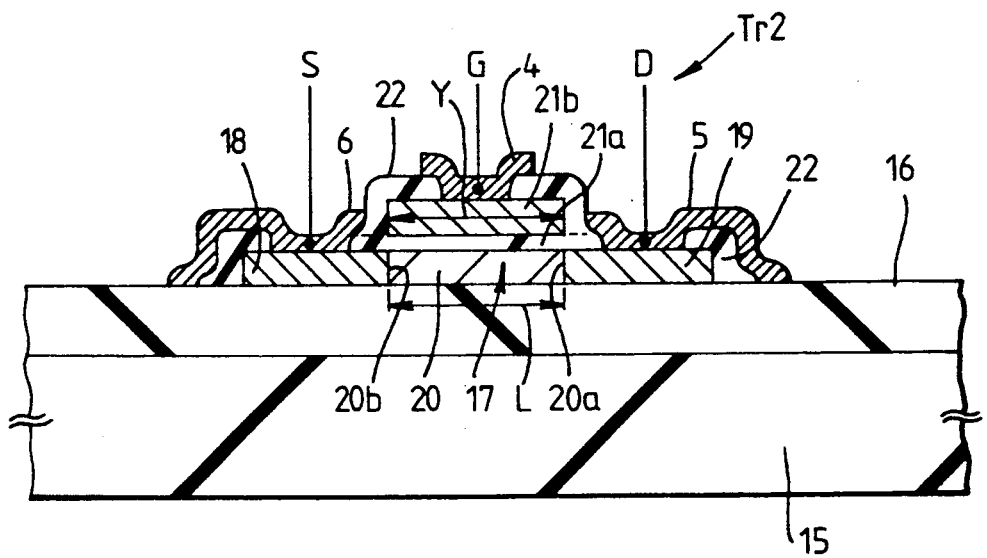
FIG. 1 is a schematic cross-sectional view of a thin-film transistor for use in a thin-film transistor circuit in accordance with the invention.

Referring firstly to FIG. 1, although only one thin-film transistor, Tr2 for example, is illustrated it will be appreciated that the three transistors Tr1, Tr2 and Tr3 of the circuit shown in FIG. 2 will be formed simultaneously and interconnected, in conventional manner, by appropriate patterning of the metallisation forming the source, gate and drain electrodes. Of course, the dimensions of the subsidiary thin-film transistors Tr2 and Tr3 may differ from those of the main thin-film transistor Tr1. Thus, for example, the first and second subsidiary thin-film transistors Tr2 and Tr3 may be larger in area than the main thin-film transistor Tr1 to enable the first and second subsidiary thin-film transistors Tr2 and Tr3 to handle higher currents. Alternatively, there may be circumstances where it is desirable for the first and second subsidiary thin-film transistors Tr2 and Tr3 to be smaller in area than the main thin-film transistor Tr1. These variations may be accommodated in conventional manner by appropriate definition of the various masks used to form the circuit.

As shown in FIG. 1, the thin-film transistor circuit 10 is formed on an insulating substrate comprising a base 15 of a glass capable of withstanding temperatures of up to 650 degrees Celsius, for example Hoya NA40, Corning 1733 or Asahi AN, onto which is provided a layer of silicon dioxide 16.

A semiconductor layer, in the example a polycrystalline silicon layer, is then deposited by conventional chemical vapour deposition techniques and defined using conventional techniques to form a semiconductor region 17 for each transistor (only that for Tr2 being shown). A layer of insulating material, for example silicon dioxide, is then deposited on the semiconductor using conventional chemical vapour deposition followed by a further semiconductor, again a polycrystalline silicon layer is this example, layer. The insulating layer and further semiconductor layer are then patterned using conventional techniques for defining an insulated gate composed of an insulating layer 21a and a conductive electrode layer 21b over each channel region 20. N conductivity type impurities, in the example phosphorus ions, are then introduced to form contact regions 18 and 19 for contacting the source and drain electrodes 6 and 5, respectively, and for rendering the semiconductor gate layer 21b conductive. The structure may then be heated in nitrogen to activate the implanted impurities and anneal any implantation damage.

A capping insulating layer 22 of, for example, silicon dioxide may then be deposited and contact windows opened by conventional techniques. Aluminium is then deposited and patterned to form the source, gate and drain electrodes (6,5 and 4 for Tr2) and to provide the interconnections (not shown) between the transistors Tr1, Tr2 and Tr3.

As indicated above, the subsidiary thin-film transistor Tr2 or Tr3, depending upon the polarity of the voltage applied to the gate electrode 1, will when sufficient voltage is applied, breakdown and so become conducting, in a manner similar to punch-through in a MOSFET which is, in contrast to a thin-film transistor, formed in a bulk semiconductor body, for example a monocrystalline silicon body. In a MOSFET, the depletion region associated with the drain spreads with increasing potential difference between the source and drain until it meets or punches-through to the depletion region associated with the source enabling, with increasing voltage between the source and drain, a current to flow via the connected depletion regions along the conduction channel region. In a MOSFET the punch-through voltage is dependent on $L^2$ where L is the channel length.

The voltage at which such breakdown occurs in a subsidiary thin-film transistor Tr2 or Tr3 of the present circuit is, as will be evident from the following description, similarly, although less strongly, dependent on the length L of the channel region 20. The length L of the channel region 20 can be simply determined by selecting, using appropriate mask dimensions, the length Y of the conductive electrode layer 21b of the insulated gate 21a, 21b because the contact regions 18 and 19 which bound the channel region 20 are self-aligned to the insulated gate 21a, 21b.

Experiments have been carried out to determine the effect of variation of the channel length L of a thin-film transistor Tr2 or Tr3 of the thin-film transistor circuit on the voltage at which breakdown of the thin-film transistor Tr2 or Tr3 occurs via this punch-through-like effect.

Figure 3:
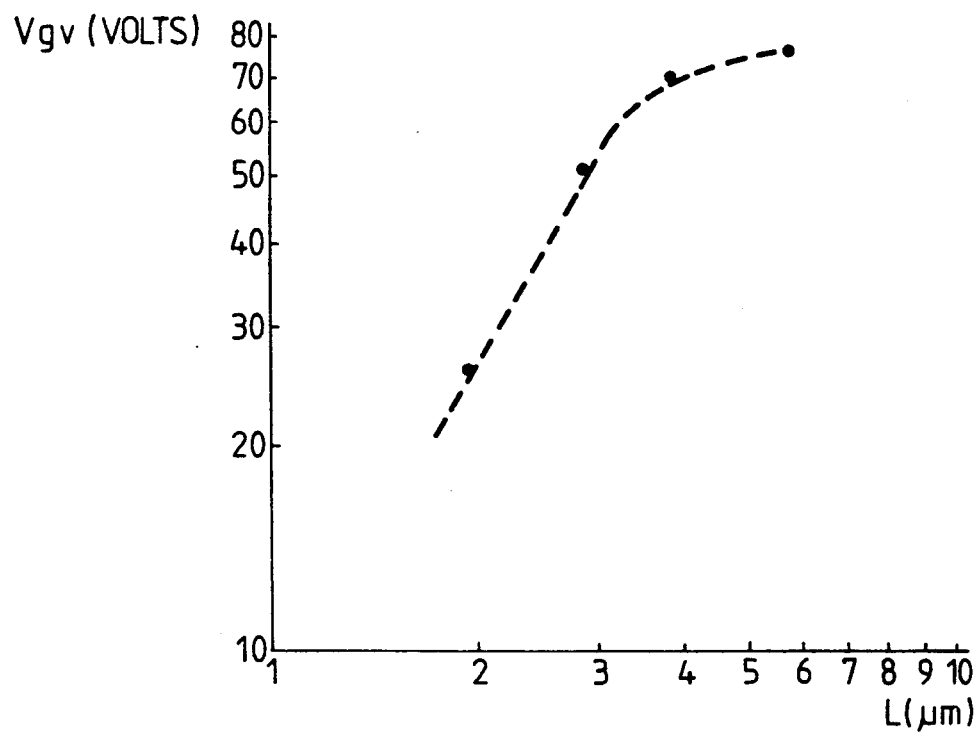
FIG. 3 is a graph illustrating the relationship between breakdown voltage $V_{BV}$ and the length L of the channel region of a thin-film transistor.

FIG. 3 is a logarithmic scale graph illustrating the relationship between breakdown voltage $V_{BV}$ and the length L of the channel region 20 for a set of typical experimental results where the subsidiary thin-film transistors had an unpassivated channel region 20 formed of small grain (that is with a mean grain size of about $70\pm30$ nanometers) polycrystalline silicon. In all cases the dots indicate actual measurements. Experiments have also been carried out where the channel region 20 has been passivated using a conventional plasma hydrogeneration process and the results obtained were not significantly different from those shown in FIG. 3.

In the experiments carried out, as evidenced by the examples given in FIG. 3, the voltage $V_{BV}$ at which breakdown occurs via this punch-through-like mechanism is related to, approximately, $L^{1.6}$ and so appears less strongly power dependent on the channel length L than in the case for punch-through in MOSFETs.

Typically where the thin-film transistor circuit is to be used in, for example, an active matrix addressed display device then the channel regions 20 of the subsidiary thin-film transistors Tr2 and Tr3 may have a length L selected to provide a breakdown voltage in the region of from about 20 to about 30 volts.

Figure 4:
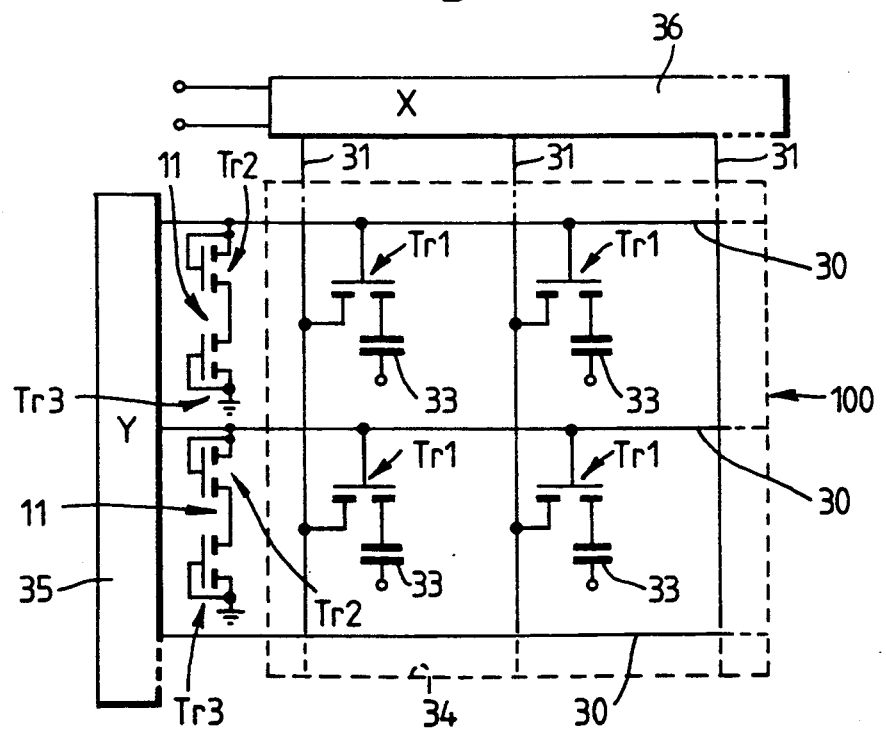
FIG. 4 is a plan schematic view of an active matrix addressed display device using thin-film transistor circuits in accordance with the invention.

FIG. 4 illustrates diagrammatically a typical example of a display device 100 incorporating a plurality of main thin-film transistors Tr1 which act, in known manner, as switching elements.

As shown in FIG. 4, the main thin-film transistors Tr1 are arranged in a matrix of 1-m rows 30 and 1-n columns 31. Each row 30 has an associated protection device 11 of the type described above with reference to FIG. 2. For the sake of convenience only two rows and two columns are shown in FIG. 4. Of course, as will be evident from the above, all the thin-film transistors Tr1, Tr2 and Tr3 are formed on the same insulating substrate 15, 16. Apart from the input gate protection devices 11, the circuit shown in FIG. 4 is similar to conventional widely documented active matrix addressed display devices and will therefore not be described in detail.

The drain electrodes 2 of the main thin-film transistors Tr1 are connected to respective picture element electrodes 33 carried on the substrate 15, 16 adjacent to, and laterally spaced from, the thin-film transistors Tr1. The picture element electrodes 33 together with respective common regions of a common electrode carried on a further glass substrate and a display medium, usually a liquid crystal material, sandwiched between the substrate constitute picture elements. The dashed line 34 illustrates the display area.

In operation of the device the rows of thin-film transistor (TFTs) Tr1 are repetitively and sequentially addressed. A scanning signal is applied to a row line 30 via an Y or row decoder/addressing circuit 35 to render that row of TFTs Tr1 conducting and video information supplied to the appropriate columns 31 via an X or column decoder/addressing circuit 36 to charge up the picture elements associated with the conducting TFTs. When the voltage is removed from the row line to turn-off the associated TFTs the video information voltages are retained until the next time the row is addressed.

Although in the example described above with reference to FIG. 4, only one input gate protection device 11 is provided for each row 30 of the main thin-film transistor matrix of the display device 100, it would, of course, be possible for each main thin-film transistor Tr1 to have its own input gate protection device 11. Such an arrangement would, however, increase the overall area of the display device 100.

A thin-film transistor circuit in accordance with the invention may also be used in other thin-film transistor devices, for example in shift registers and clocking circuits.

Also, a thin-film circuit in accordance with the invention may comprise a display device and associated control circuitry, for example shift registers and clocking circuits, integrated on the same substrate. In such cases, input gate protection devices 11 may be associated with any of the main thin-film transistors where such protection is considered desirable. In addition, by appropriate modification of the mask used to form the insulated gate conductive electrode layer 21b of the subsidiary thin-film transistors Tr2 and Tr3 forming the input gate protection devices 11, the channel lengths of the subsidiary thin-film transistors Tr2 and Tr3 can be varied between input gate protection devices 11 on the same substrate so that the input gate protection devices 11 may be tailored to meet different gate over-voltage protection requirements at different circuit areas within the overall device.

Although in the example described above, the channel regions 20 are formed of polycrystalline silicon, other semiconductor materials, for example amorphous silicon or other polycrystalline or amorphous semiconductor materials, could be used. Also p-channel as opposed to n-channel TFTs could be used as the subsidiary thin-film transistors. Also when rendered conducting the input gate protection device 11 may, for example, short the gate electrode 1 to one of the main electrodes 2, 3 of the main thin-film transistor rather than to earth (ground).

From reading the present disclosure, other modifications will be apparent to persons skilled in the art. Such modifications may involve other features which are already known in the thin-film transistor and/or liquid crystal display device art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A thin-film transistor circuit comprising a main thin film transistor and two subsidiary thin film transistors, each of said main and subsidiary thin film transistors having respective source, drain and gate electrodes, wherein for each of said subsidiary thin film transistors, its respective gate electrode and one of its respective source and drain electrodes are coupled together and the other of said source and drain electrodes of each of said subsidiary thin film transistors are coupled together, each of said subsidiary thin film transistors having:

a respective threshold voltage at which the respective subsidiary thin film transistor is rendered conducting when a first voltage of a first polarity exceeding said respective threshold voltage is applied to its respective gate electrode; and a respective channel region with a length selected for causing the respective subsidiary thin film transistor to break down when a second voltage of a polarity opposite to the first polarity and exceeding the threshold voltage of the other subsidiary thin film transistor is applied across the source and drain electrodes of the respective subsidiary thin film transistor;

wherein said subsidiary thin film transistors are coupled between the gate electrode of said main thin film transistor and a reference potential so as to form an input protection device which causes a first of said subsidiary thin film transistors to conduct and a second of said subsidiary thin film transistors to break down when a third voltage exceeding said first voltage, is applied to the gate electrode of said main thin film transistor, and for causing said second subsidiary thin film transistor to conduct and said first subsidiary thin film transistor to break down when a fourth voltage having a polarity opposite to that of said third voltage and exceeding said first voltage is applied to the gate electrode of the main thin film transistor.

2. A thin-film transistor circuit according to claim 1, wherein the gate and drain electrodes of said second thin-film transistor are connected together and to the gate electrode of said first thin-film transistor and the gate and source electrodes said third thin-film transistor are connected together and to ground.

3. A thin-film transistor circuit according to claim 1 wherein each of said second and third thin-film transistors has a respective channel region length selected such that its break down voltage is in the range of from about 20 to about 30 volts.

4. A thin-film transistor circuit according to claim 1, wherein the channel region of each of said second and third thin-film transistors is formed of polycrystalline silicon and is bounded at each end by highly doped n conductivity type contact regions connecting with its source and drain electrodes.

5. A thin film transistor circuit according to claim 4, wherein the channel region of each of said second and third thin-film transistors is passivated by plasma hydrogenation.

6. A thin-film transistor circuit according to claim 1, wherein a plurality of main thin-film transistors are provided together with at least one input gate protection device.

7. A thin-film transistor circuit according to claim 6, wherein the main thin-film transistors are arranged in a matrix of rows and columns of main thin-film transistors with each row of main thin-film transistors having an input gate protection device.

8. A liquid crystal display device incorporating a thin-film transistor circuit in accordance with claim 1.

9. A thin-film transistor circuit according to claim 2, wherein each of said second and third thin-film transistors has a respective channel region length selected such that its break down voltage is in the range of from about 20 to about 30 volts.

10. A thin-film transistor circuit according to claim 2, wherein the channel region of each of said second and third thin-film transistors is formed of polycrystalline silicon and is bounded at each end by highly doped n conductivity type contact regions connecting with its source and drain electrodes.

11. A thin-film transistor circuit according to claim 3, wherein the channel region of each of said second and third thin-film transistors is formed of polycrystalline silicon and is bounded at each end by highly doped n conductivity type contact regions connecting with its source and drain electrodes.

12. A thin-film transistor circuit according to claim 9, wherein the channel region of each of said second and third thin-film transistors is formed of polycrystalline silicon and is bounded at each end by highly doped n conductivity type contact regions connecting with its source and drain electrodes.

13. A thin film transistor circuit according to claim 10, wherein the channel region of each of said second and third thin-film transistors is passivated by plasma hydrogenation.

14. A thin film transistor circuit according to claim 11, wherein the channel region of each of said second and third thin-film transistors is passivated by plasma hydrogenation.

15. A thin film transistor circuit according to claim 12, wherein the channel region of each of said second and third thin-film transistors is passivated by plasma hydrogenation.

16. A thin-film transistor circuit according to claim 5, wherein a plurality of main thin-film transistors are provided together with at least one input gate protection device.

17. A thin-film transistor circuit according to claim 15, wherein a plurality of main thin-film transistors are provided together with at least one input gate protection device.

18. A thin-film transistor circuit according to claim 5, wherein the main thin-film transistors are arranged in a matrix of rows and columns of main thin-film transistors with each row of main thin-film transistors having an input gate protection device.

19. A thin-film transistor circuit according to claim 17, wherein the main thin-film transistors are arranged in a matrix of rows and columns of main thin-film transistors with each row of main thin-film transistors having an input gate protection device.

20. A liquid crystal display device incorporating a thin-film transistor circuit in accordance with claim 19.

21. A thin film transistor circuit according to claim 1 wherein each of said second and third thin film transistors has a respective channel region length of from about 1.7 to 2.2 micrometers.

22. A liquid crystal display device comprising:
a) a matrix of liquid crystal picture elements with each picture element having a picture electrode;
b) a plurality of main thin film transistors each having first and second main electrodes and a gate electrode, the main thin film transistors being arranged in a matrix of rows and columns with each main thin film transistor having one main electrode connected to a respective picture electrode;
c) a plurality of row conductors with each row conductor being connected to the gate electrode of each one of said main thin film transistors in a respective row of main thin film transistors;
d) a plurality of column conductors with each column conductor being connected to the other main electrode of each of said main thin film transistors in a respective column of main thin film transistors;
e) a row decoder/addressing circuit connected to each row conductor for causing the main thin film transistors in a selected row to become conducting;
f) a column decoder/addressing circuit connected to each column conductor for allowing charge to be supplied to the main thin film transistors of a selected column which have been rendered conducting by the row decoder/addressing circuit;
g) a plurality of input gate protection circuits, each coupled to a respective one of said row conductors and each comprising first and second subsidiary thin film transistors each having a source electrode, a drain electrode and a gate electrode, the gate electrode of said first subsidiary thin film transistor being connected to its drain electrode, the gate electrode of said second subsidiary thin film transistor being connected to its source electrode, and the source electrode of the said first subsidiary thin film transistor being connected to the drain electrode of said second subsidiary thin film transistor, each of said first and second thin film transistors having:

a respective threshold voltage at which the respective subsidiary thin film transistor is rendered conducting when a first voltage of a first polarity exceeding said respective threshold voltage is applied to its respective gate electrode; and a respective channel region with a length selected for causing the respective subsidiary thin film transistor to break down when a second voltage of a polarity opposite to the first polarity and exceeding the threshold voltage of the other subsidiary thin film transistor is applied across the source and drain electrodes of the respective subsidiary thin film transistor;

wherein said subsidiary thin film transistors are coupled between the gate electrode of said main thin film transistor and a reference potential so as to form an input protection device which causes a first of said subsidiary thin film transistors to conduct and a second of said subsidiary thin film transistors to break down when a third voltage exceeding said first voltage, is applied to the gate electrode of said main thin film transistor, and for causing said second subsidiary thin film transistor to conduct and said first subsidiary thin film transistor to break down when a fourth voltage having a polarity opposite to that of said third voltage and exceeding said first voltage is applied to the gate electrode of the main thin film transistor.

* * * * *